(12) United States Patent
Dawson et al.

(10) Patent No.: US 7,099,206 B2
(45) Date of Patent: Aug. 29, 2006

(54) HIGH DENSITY BITLINE SELECTION APPARATUS FOR SEMICONDUCTOR MEMORY DEVICES

(75) Inventors: James W. Dawson, Poughkeepsie, NY (US); Donald W. Plass, Poughkeepsie, NY (US); Kenneth J. Reyer, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 11/046,101

(22) Filed: Jan. 28, 2005

(65) Prior Publication Data

US 2006/0171215 A1    Aug. 3, 2006

(51) Int. Cl.
*G11C 7/00* (2006.01)

(52) U.S. Cl. .......................... 365/190; 365/63; 365/188

(58) Field of Classification Search ................ 365/190, 365/63, 188
See application file for complete search history.

(56) References Cited

U.S. PATENT DOCUMENTS

| | | | | |
|---|---|---|---|---|
| 5,808,500 A | * | 9/1998 | Kalpakjian | 365/230.06 |
| 6,175,532 B1 | * | 1/2001 | Ooishi | 365/230.03 |
| 6,188,596 B1 | * | 2/2001 | Holst | 365/63 |
| 6,198,682 B1 | * | 3/2001 | Proebsting | 365/190 |
| 6,707,753 B1 | | 3/2004 | Clark et al. | 365/230.06 |
| 2004/0109337 A1 | | 6/2004 | Mayer et al. | 365/63 |
| 2004/0246812 A1 | | 12/2004 | Bhavnagarwala et al. | 365/233 |

* cited by examiner

*Primary Examiner*—Tuan T. Nguyen
(74) *Attorney, Agent, or Firm*—Lynn Augspurger; Cantor Colburn LLP

(57) ABSTRACT

A bitline selection apparatus for a semiconductor memory device includes a first local bitline pair and a second local bitline pair selectively coupled to a global bitline pair, each of the first and second local bitline pairs including a true bitline and a complementary bitline. Each of the true bitlines is selectively coupled to a common true node through an n-type pass device and a p-type pass device in parallel therewith, and each of the complementary bitlines is selectively coupled to a common complementary node through an n-type pass device and a p-type pass device in parallel therewith.

21 Claims, 3 Drawing Sheets

HIGH DENSITY BITLINE SELECTION APPARATUS FOR SEMICONDUCTOR MEMORY DEVICES

BACKGROUND OF THE INVENTION

The present invention relates generally to integrated circuit devices, and, more particularly, to a high-density bitline selection apparatus for semiconductor memory devices.

Static Random Access Memories (SRAMs) are memory elements that store data in the form of complementary low voltage and high voltage at opposite sides of the memory cell. An SRAM retains the memory value therein so long as power is applied to the circuit, unlike dynamic random access memory (DRAM) that must be periodically refreshed in order for the data to be maintained therein. Conventionally, if the "true" node of an SRAM is read as a high voltage, then the value of the SRAM cell is logical one. Conversely, if the true node is read as a low voltage, the value of the SRAM cell is logical zero.

Due to the high degree of miniaturization possible today in semiconductor technology, the size and complexity of designs that may be implemented in hardware has increased dramatically. This has made it technologically feasible and economically viable to develop high-speed, application specific architectures featuring a performance increase over previous architectures. Process scaling has been used in the miniaturization process to reduce the area needed for both logic functions and memory (such as SRAM) in an effort to lower the product costs. Process scaling continues to improve performance, but can also come at the expense of power.

Precharged Complementary Metal Oxide Semiconductor (CMOS) domino logic techniques may be applied to functional blocks to reduce power. Accordingly, domino logic forms an attractive design style for high performance designs since its low switching threshold and reduced transistor count leads to fast and area efficient circuit implementations. Thus, domino CMOS has become a prevailing logic family for many high performance CMOS applications (including SRAM devices) and is used in many state-of-the-art processors due to its high-speed capabilities. Notwithstanding such architectures, however, it is still desirable to be able to implement a memory select circuit, such as a local bitline select circuit, in a manner that utilizes fewer devices resulting in less area. This is particularly desirable for large SRAM devices, in which a local bitline select circuit is a significant pitch concern.

BRIEF SUMMARY OF THE INVENTION

The foregoing discussed drawbacks and deficiencies of the prior art are overcome or alleviated by a bitline selection apparatus for a semiconductor memory device. In an exemplary embodiment, the apparatus includes a first local bitline pair and a second local bitline pair selectively coupled to a global bitline pair, each of the first and second local bitline pairs including a true bitline and a complementary bitline. Each of the true bitlines is selectively coupled to a common true node through an n-type pass device and a p-type pass device in parallel therewith, and each of the complementary bitlines is selectively coupled to a common complementary node through an n-type pass device and a p-type pass device in parallel therewith.

In another embodiment, a semiconductor memory device includes a plurality of memory subarrays each having a first plurality of memory storage cells selectively coupled to a first local bitline pair, and a second plurality of memory storage cells selectively coupled to a second local bitline pair. A plurality of local bitline selection circuits is correspondingly associated with each of the plurality of memory subarrays, each local bitline selection circuit configured to selectively couple a corresponding one of the first local bitline pair and the second local bitline pair to a global bitline pair, with each of the first and second local bitline pairs having a true bitline and a complementary bitline. Each of the true bitlines is selectively coupled to a common true node of the local bitline selection circuit associated therewith through an n-type pass device and a p-type pass device in parallel therewith, and each of the complementary bitlines is selectively coupled to a common complementary node of the local bitline selection circuit associated therewith through an n-type pass device and a p-type pass device in parallel therewith.

In still another embodiment, a method for implementing local bitline selection in a semiconductor memory device includes selectively coupling a first local bitline pair and a second local bitline pair to a global bitline pair, each of the first and second local bitline pairs including a true bitline and a complementary bitline. Each of the true bitlines is selectively coupled to a common true node through an n-type pass device and a p-type pass device in parallel therewith, and each of the complementary bitlines is selectively coupled to a common complementary node through an n-type pass device and a p-type pass device in parallel therewith.

BRIEF DESCRIPTION OF THE DRAWINGS

Referring to the exemplary drawings wherein like elements are numbered alike in the several Figures.

DETAILED DESCRIPTION

Disclosed herein is a high-density, local bitline selection apparatus for semiconductor memory devices, and in particular for SRAM devices, that provides a quick restore of the local bitlines and allowing for a faster cycle. Moreover, the specific configuration of the presently disclosed bitline selection circuit (which generally is a significant pitch concern for large SRAMs) allows for fewer devices to be utilized therein, thereby resulting in the use of less device area.

Briefly stated, the bitline select circuit of the present embodiments connects the global and local bitlines of an SRAM array, and is particularly configured to select one of two bitline pairs for either a read or a write operation. The selection circuit further utilizes both p-type and n-type pass devices, which facilitates the precharging of internal true/complementary nodes directly from the bitline precharge devices, eliminating the need for separate pull-up devices (PFETs) to precharge the common nodes. In addition, the use of both p-type and n-type pass devices also provides the ability to conduct read and write operations through the pass devices. Furthermore, because a single bit select control signal is used to both couple the selected local bitline pair to the internal common nodes and simultaneously isolate the unselected local bitline pair from the internal common nodes, only two bit select lines are needed (instead of four) to control the pass devices for a one-of-two bitline pair select circuit.

Figure 1:
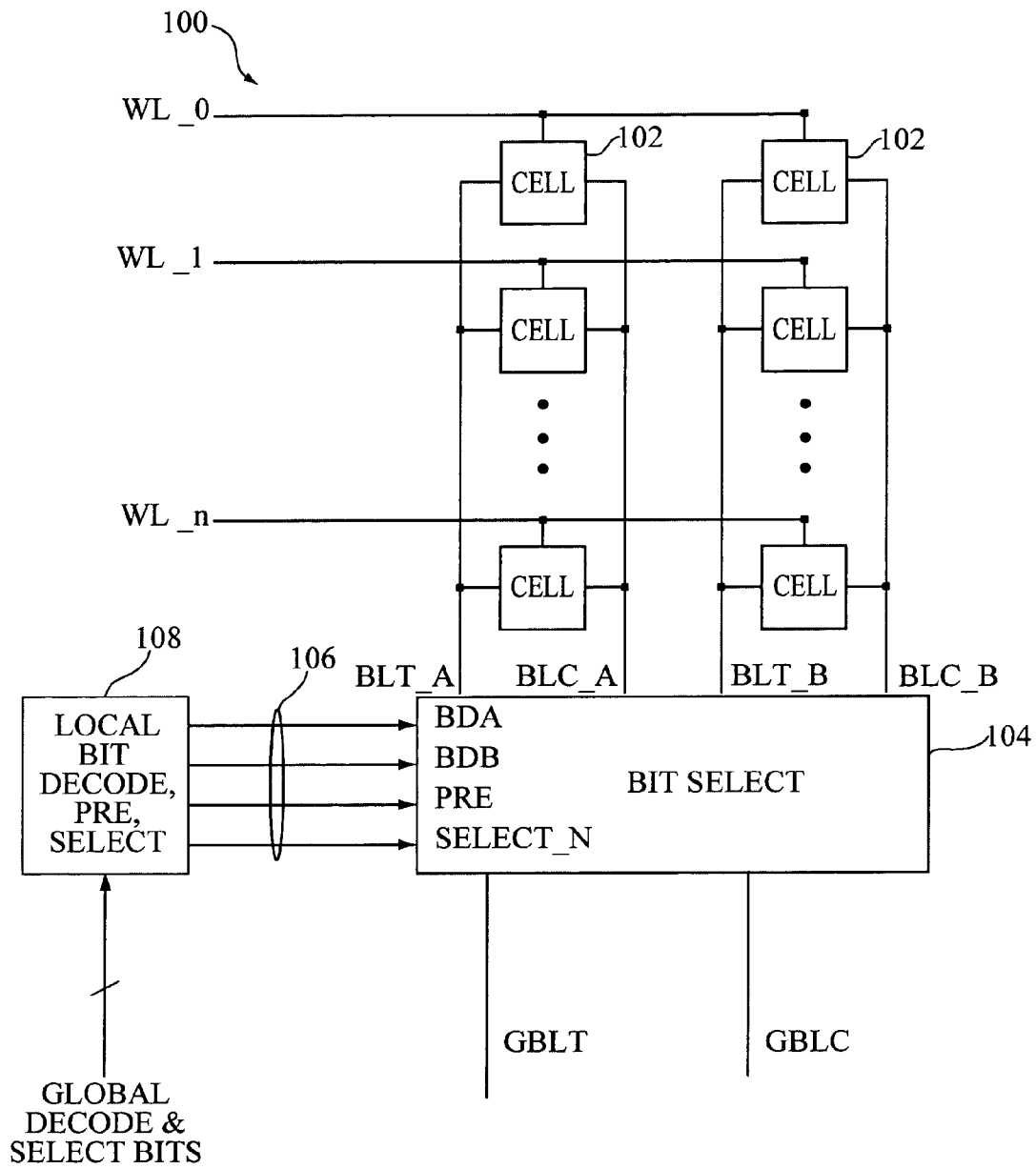
FIG. 1 is a schematic diagram of an SRAM memory array (subarray) suitable for use in accordance with an embodiment of the invention.

Referring initially to FIG. 1, there is shown a schematic diagram of an SRAM memory array 100 suitable for use in accordance with an embodiment of the invention. The array 100 includes a plurality of individual SRAM storage cells 102 such as, for example, six-transistor (6T) cells, the operation of which is well known to one skilled in the art and not discussed in further detail hereinafter. However, it will be appreciated that other known configurations of SRAM storage cells can also be utilized. The particular arrangement of the SRAM cells 102 in FIG. 1 utilizes two columns of cells that are coupled to local bitline pairs (BLT_A, BLC_A) and (BLT_B, BLC_B) respectively, which in turn are selectively coupled to global bitline pair (GBLT, GBLC) through bit select circuitry 104.

The array 100 also includes a plurality of wordlines (WL_0 through WL_n), each of which are used to activate one cell in each bitline column for a read or a write operation thereto. However, due to the 2:1 column arrangement and bit select circuitry 104, only one SRAM cell is coupled to the global bitline pair (GBLT, GBLC) for a read/write operation even though a given wordline will activate two SRAM cells 102. As is described in further detail later, the bit select circuitry 104 is controlled through a plurality of control signals 106 generated from local decoding circuitry 108. The input bits to the local decoding circuitry 108 are in turn generated from global decode circuitry (not shown in FIG. 1).

Figure 2:
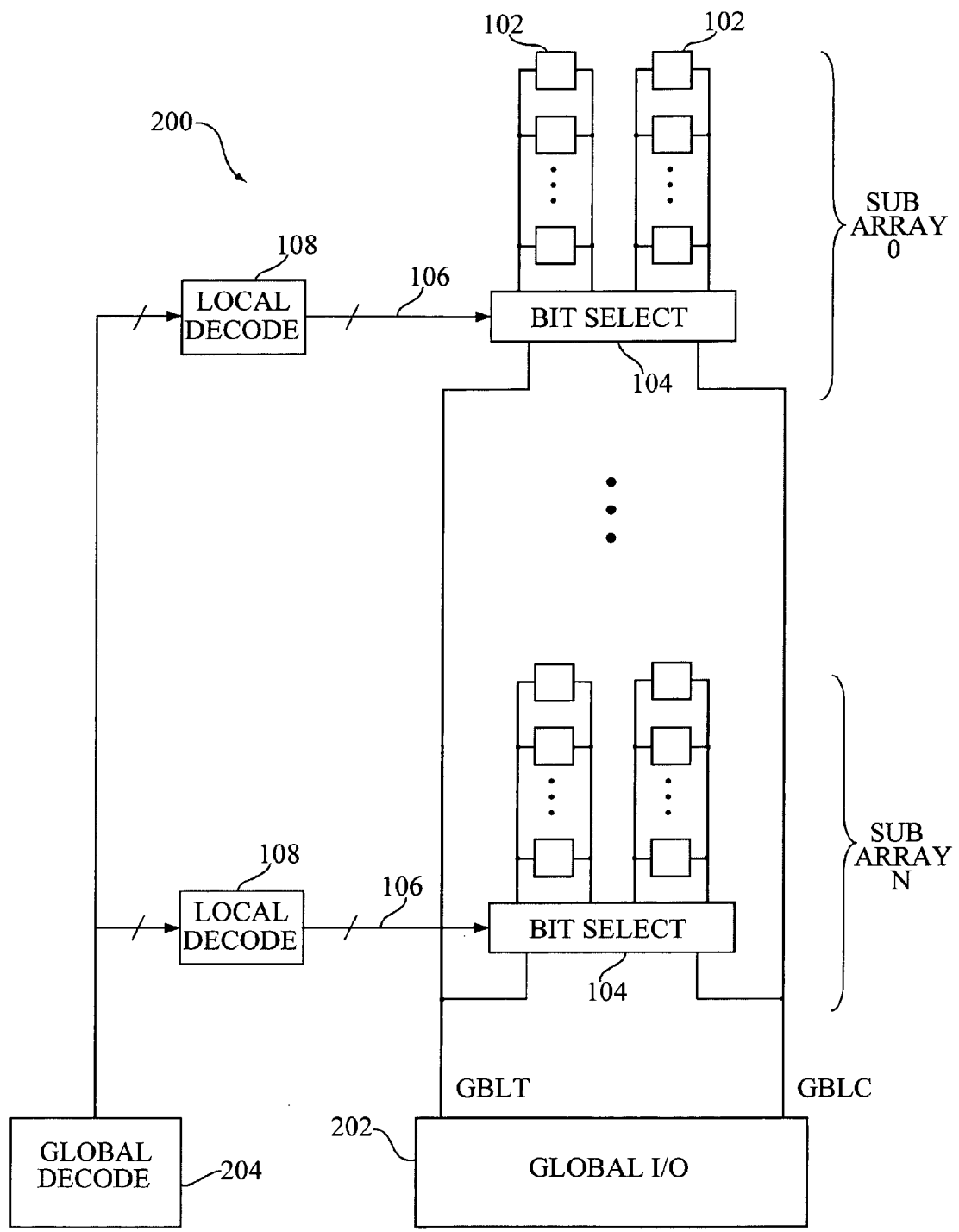
FIG. 2 is a schematic diagram of a plurality of SRAM subarrays as shown in FIG. 1 and arranged in a column configuration with respect to a global input/output circuit.

In certain SRAM architectures, such as a domino read architectures, the dual-column array 100 of FIG. 1 more particularly defines one of several subarrays (with local bit select circuitry) that are coupled to a pair of global bitlines. As shown in the schematic diagram of FIG. 2, a memory array device 200 includes a plurality of SRAM subarrays 100, local bitline select circuits 104, and local decode circuits 108 as shown in FIG. 1, each of which are arranged in a column configuration with respect to a pair of global bitlines (GBLT, GBLC) and a global input/output circuit 202. As is the case with the local selection of one-of-two bitline columns for coupling to the global bitlines (GBLT, GBLC), the global decode circuitry 204 is configured so as to allow a selected bitline pair from only one of the subarrays 100 to be coupled to global bitlines (GBLT, GBLC) during a given read/write cycle. In other words, the global decode circuitry 204 determines which of the local decode circuits 108 will generate a selected local bitline pair for coupling to the global bitlines.

Figure 3:
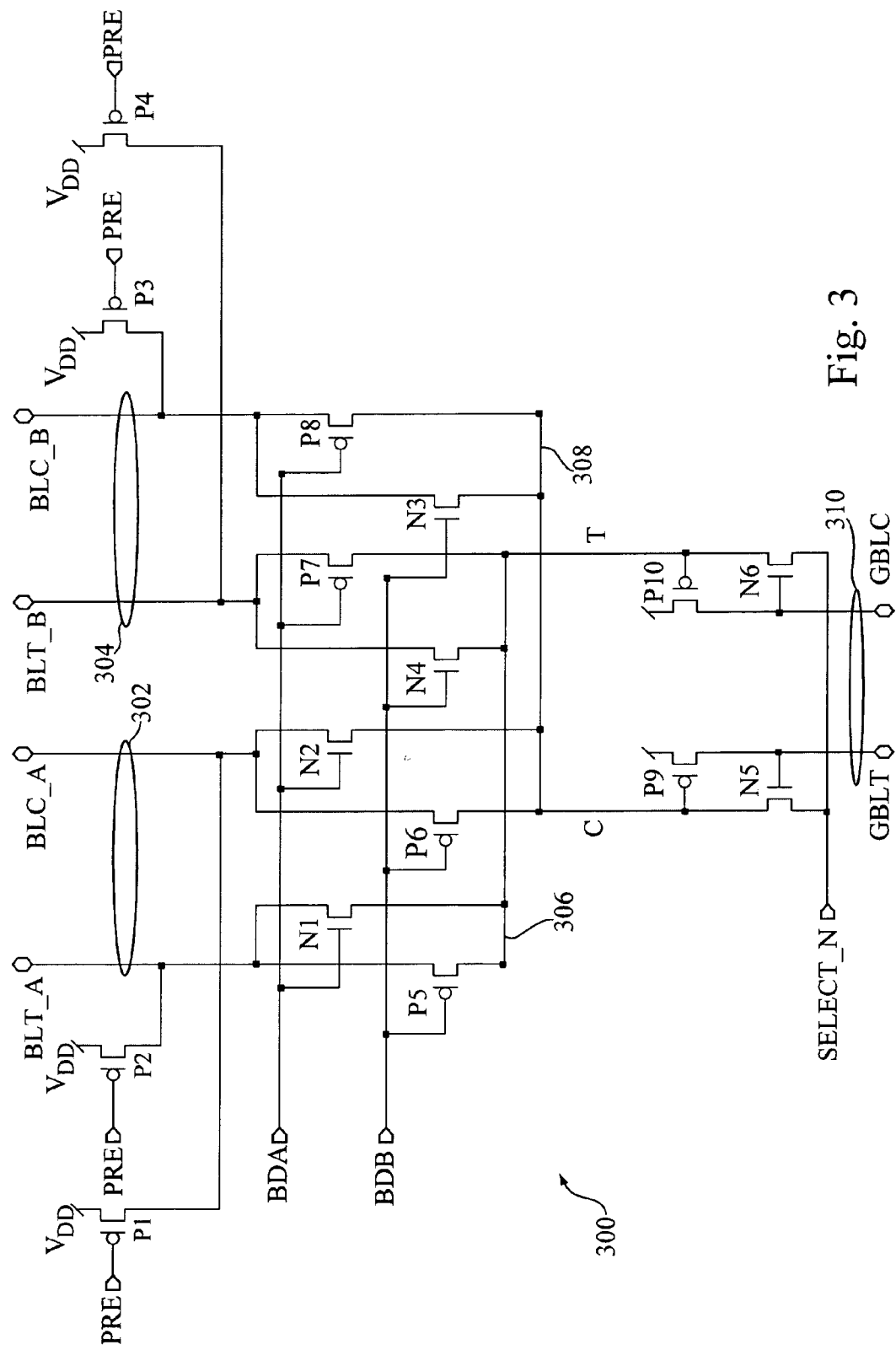
FIG. 3 is a schematic diagram of a bitline selection apparatus in accordance with an embodiment of the invention.

Referring now to FIG. 3, a schematic diagram of a local bitline selection apparatus 300 is illustrated in accordance with an embodiment of the invention. As is shown, the apparatus 300 includes various p-type and n-type field effect transistors (PFETs, NFETs), the operation of which will be recognized by one skilled in the art. In the embodiment illustrated, the local bitline selection apparatus 300 is used to selectively couple one of two local bitline pairs (BLT_A, BLC_A) 302 and (BLT_B, BLC_B) 304 to a single pair of true and complement common nodes (T) 306 and (C) 308. Common nodes 306 and 308 are further coupled to a single global bitline pair 310 (GBLT, GBLC). It should appreciated, however, that the configuration of FIG. 3 is exemplary in nature and that the principles disclosed herein are applicable to different numbers of local and global bitline combinations.

The local bitline pairs 302, 304 are precharged to a logical high voltage (e.g., $V_{DD}$), as reflected by pull up PFETs P1, P2, P3 and P4, when a precharge control signal (PRE) is set at a logic low level. In an exemplary embodiment, the precharge control signals are coupled to a separate power supply having a higher voltage with respect to the $V_{DD}$ supply. Thus configured, the precharge devices P1 through P4 may be fabricated with a low threshold voltage ($V_t$) without concern for leakage since during the deactivation thereof, the gate voltage exceeds the source voltage coupled to the lower voltage $V_{DD}$ supply. Beneficially, the low $V_t$ precharge devices provide an improved "on" conductance for better performance.

Each bitline of the bitline pairs 302, 304 is provided with an NFET pass device (N1 through N4), as well as a parallel PFET pass device P5 through P8. The NFET pass devices enable a read operation of data from the SRAM cells (not shown in FIG. 3) through the associated bitline pair, while the PFET pass devices enable a write operation of data from the global bitline pair 310 to the associated bitline pair. As is the case with the precharge PFETs (P1 through P4), the PFET pass gates P5 through P8 may also be low $V_t$ devices since the bitline select control signals BDA, BDB, are also associated with the higher supply voltage with respect to the $V_{DD}$ supply. Another advantage of having PFET pass devices associated with the bitlines is the ability to precharge the common nodes 306, 308 using existing precharge PFETS P1 through P4. In other words, separate pull up devices are not needed for precharging common nodes 306 and 308, thereby additionally reducing the total number of devices for the circuit.

It will be noted that although both the true and complement bitlines in each bitline pair have NFET and PFET pass devices, only two control signals BDA, BDB are utilized. In particular, it is noted that control signal BDA controls NFET pass devices N1 and N2 for the first bitline pair 302, while controlling the PFET pass devices P7 and P8 for the second bitline pair 304. In contrast, control signal BDB controls PFET pass devices P5 and P6 for the first bitline pair 302, while controlling the NFET pass devices N3 and N4 for the second bitline pair 304. In this manner, each control signal simultaneously turns certain devices on and certain devices off, thus permitting the use of two signals instead of four.

In order to receive data read from a selected bitline pair 302, 304, onto the global bitline pair 310, a pair of pull up PFET devices P9, P10 are associated with the complement and true nodes 308, 306, respectively. Thus, whichever of the true and complement nodes has a logical low signal thereon, the associated PFET device pulls up the opposite global bitline to a logic high level. Finally, a pair of pull down NFET devices N5 and N6 are coupled to the global bitline pair 310 for enabling a pull down path for a write operation of a selected SRAM cell, wherein the pull down path is active by a low signal on SELECT_N.

In operation of apparatus 300, control signals BDA, BDB and PRE are all initially low. This precharges each of the bitlines to $V_{DD}$, as well as the common nodes 306, 308. Because both common nodes are precharged high, PFETs P9 and P10 are non conductive, this isolating the global bitline pair 310 from rest of the selection circuitry. For a read operation, precharge signal PRE goes high (again at a higher voltage than $V_{DD}$) to deactivate precharge devices P1 through P4. If, for example, data is to be read from the first bitline pair 302, then control signal BDA also goes high.

This activates N1 and N2 while, at the same time, deactivates P7 and P8 so as to isolate bitline pair 304 from the common nodes 306, 308. By further way of example, if the data on the bitline pair is "1" (i.e., bitline BLT_A is high and BLC_A is low), then activated pass device N2 allows the voltage on the common complement node 308 to be pulled to ground, with common true node 306 remaining at $V_{DD}$. Once node 308 is pulled to ground, P9 is rendered conductive, and logic "1" data is introduced onto global bitline GBLT to complete the read operation.

In comparison, it is now assumed logic "0" data is to be written to a cell associated with local bitline pair 304. In this case, control signal BDB goes from low (the precharge state) to high, which isolates the first bitline pair 302 from the common nodes 306, 308. With a logic "0" write voltage being present on GBLT, a logic "1" voltage is present on GBLC. This renders N6 conductive, causing the voltage on node 306 to be pulled to ground (again, SELECT_N being low during an active cycle). Moreover, since BDB is high, N4 is also rendered conductive so as to bring BLT_B from a precharged high voltage to ground. Accordingly, the proper signal values are now present on BLT_B and BLC_B for writing a "0" to the cell associated with bitline pair 304.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A bitline selection apparatus for a semiconductor memory device, comprising:
   a first local bitline pair and a second local bitline pair selectively coupled to a global bitline pair, each of said first and second local bitline pairs comprising a true bitline and a complementary bitline;
   each of said true bitlines selectively coupled to a common true node through an n-type pass device and a p-type pass device in parallel therewith; and
   each of said complementary bitlines selectively coupled to a common complementary node through an n-type pass device and a p-type pass device in parallel therewith.

2. The bitline selection apparatus of claim 1, wherein said global bitline pair comprises a true global bitline associated with said common complementary node and a complementary global bitline associated with said common true node.

3. The bitline selection apparatus of claim 1, wherein a first control signal is used to control said n-type pass devices of said first bitline pair and said p-type pass devices of said second bitline pair, and a second control signal is used to control said p-type pass devices of said first bitline pair and said n-type pass devices of said second bitline pair.

4. The bitline selection apparatus of claim 3, further comprising a plurality of precharge devices for precharging said first and second local bitline pairs in preparation for one of a read and a write operation, wherein said plurality of precharge devices are also used to precharge said common true node and said common complementary node.

5. The bitline selection apparatus of claim 4, wherein said plurality of precharge devices further comprise p-type pass devices.

6. The bitline selection apparatus of claim 5, wherein said p-type pass devices of said plurality of precharge devices and said p-type pass devices selectively coupling said first and second local bitline pairs to said common true and complementary nodes are low threshold voltage devices.

7. The bitline selection apparatus of claim 6, wherein said p-type pass devices of said plurality of precharge devices and said p-type pass devices selectively coupling said first and second local bitline pairs to said common true and complementary nodes have a gate terminal selectively coupled to an off voltage exceeding that of $V_{DD}$, wherein $V_{DD}$ defines a logic high value of the memory device.

8. A semiconductor memory device, comprising:
   a plurality of memory subarrays each having a first plurality of memory storage cells selectively coupled to a first local bitline pair, and a second plurality of memory storage cells selectively coupled to a second local bitline pair;
   a plurality of local bitline selection circuits correspondingly associated with each of said plurality of memory subarrays, each said local bitline selection circuit configured to selectively couple a corresponding one of said first local bitline pair and said second local bitline pair to a global bitline pair, with each of said first and second local bitline pairs comprising a true bitline and a complementary bitline;
   each of said true bitlines selectively coupled to a common true node of the local bitline selection circuit associated therewith through an n-type pass device and a p-type pass device in parallel therewith; and
   each of said complementary bitlines selectively coupled to a common complementary node of the local bitline selection circuit associated therewith through an n-type pass device and a p-type pass device in parallel therewith.

9. The memory device of claim 8, wherein said global bitline pair comprises a true global bitline associated with said common complementary node and a complementary global bitline associated with said common true node.

10. The memory device of claim 8, wherein, for each of said plurality of local bitline selection circuits, a first control signal is used to control said n-type pass devices of said first bitline pair and said p-type pass devices of said second bitline pair, and a second control signal is used to control said p-type pass devices of said first bitline pair and said n-type pass devices of said second bitline pair.

11. The memory device of claim 10, further comprising a plurality of precharge devices for precharging said first and second local bitline pairs in preparation for one of a read and a write operation, wherein said plurality of precharge devices are also used to precharge said common true node and said common complementary node.

12. The memory device of claim 11, wherein said plurality of precharge devices further comprise p-type pass devices.

13. The memory device of claim 12, wherein said p-type pass devices of said plurality of precharge devices and said p-type pass devices selectively coupling said first and second local bitline pairs to said common true and complementary nodes are low threshold voltage devices.

14. The memory device of claim 13, wherein said p-type pass devices of said plurality of precharge devices and said p-type pass devices selectively coupling said first and second local bitline pairs to said common true and complementary nodes have a gate terminal selectively coupled to an off voltage exceeding that of $V_{DD}$, wherein $V_{DD}$ defines a logic high value of the memory device.

15. A method for implementing local bitline selection in a semiconductor memory device, the method comprising:
   selectively coupling a first local bitline pair and a second local bitline pair to a global bitline pair, each of said first and second local bitline pairs comprising a true bitline and a complementary bitline;
   selectively coupling each of said true bitlines to a common true node through an n-type pass device and a p-type pass device in parallel therewith; and
   selectively coupling each of said complementary bitlines to a common complementary node through an n-type pass device and a p-type pass device in parallel therewith.

16. The method of claim 14, wherein said global bitline pair comprises a true global bitline associated with said common complementary node and a complementary global bitline associated with said common true node.

17. The method of claim 15, wherein a first control signal is used to control said n-type pass devices of said first bitline pair and said p-type pass devices of said second bitline pair, and a second control signal is used to control said p-type pass devices of said first bitline pair and said n-type pass devices of said second bitline pair.

18. The method of claim 17, further comprising configuring a plurality of precharge devices for precharging said first and second local bitline pairs in preparation for one of a read and a write operation, wherein said plurality of precharge devices are also used to precharge said common true node and said common complementary node.

19. The method of claim 18, wherein said plurality of precharge devices further comprise p-type pass devices.

20. The method of claim 19, wherein said p-type pass devices of said plurality of precharge devices and said p-type pass devices selectively coupling said first and second local bitline pairs to said common true and complementary nodes are low threshold voltage devices.

21. The method of claim 20, wherein said p-type pass devices of said plurality of precharge devices and said p-type pass devices selectively coupling said first and second local bitline pairs to said common true and complementary nodes have a gate terminal selectively coupled to an off voltage exceeding that of $V_{DD}$, wherein $V_{DD}$ defines a logic high value of the memory device.

* * * * *